US012463094B2

(12) United States Patent
Huotari et al.

(10) Patent No.: US 12,463,094 B2
(45) Date of Patent: Nov. 4, 2025

(54) MULTIPLE-LAYER METHOD AND SYSTEM FOR FORMING MATERIAL WITHIN A GAP

(71) Applicant: ASM IP Holding B.V., Almere (NL)

(72) Inventors: Hannu Huotari, Helsinki (FI); Viljami Pore, Helsinki (FI); Timothee Blanquart, Oud-Heverlee (BE); René Henricus Jozef Vervuurt, Leuven (BE); Charles Dezelah, Helsinki (FI); Giuseppe Alessio Verni, Jodoigne (BE); Ren-Jie Chang, Leuven (BE); Michael Givens, Oud-Heverlee (BE); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 523 days.

(21) Appl. No.: 17/953,585

(22) Filed: Sep. 27, 2022

(65) Prior Publication Data

US 2023/0101229 A1    Mar. 30, 2023

Related U.S. Application Data

(60) Provisional application No. 63/250,302, filed on Sep. 30, 2021.

(51) Int. Cl.
| | | |
|---|---|---|
| *H01L 21/768* | (2006.01) | |
| *H01L 21/02* | (2006.01) | |
| *H01L 21/67* | (2006.01) | |

(52) U.S. Cl.
CPC .. *H01L 21/76882* (2013.01); *H01L 21/02126* (2013.01); *H01L 21/0228* (2013.01); *H01L 21/67109* (2013.01); *H01L 21/76832* (2013.01)

(58) Field of Classification Search
None
See application file for complete search history.

(56) References Cited

U.S. PATENT DOCUMENTS

2020/0365447 A1* 11/2020 Mays ............... H01L 21/76224

* cited by examiner

*Primary Examiner* — Asok K Sarkar
(74) *Attorney, Agent, or Firm* — Snell & Wilmer L.L.P.

(57) ABSTRACT

A multiple-layer method for forming material within a gap on a surface of a substrate is disclosed. An exemplary method includes forming a layer of first material overlying the substrate and forming a layer of second (e.g., initially flowable) material within a region of the first material to thereby at least partially fill the gap with material in a seamless and/or void less manner.

20 Claims, 8 Drawing Sheets

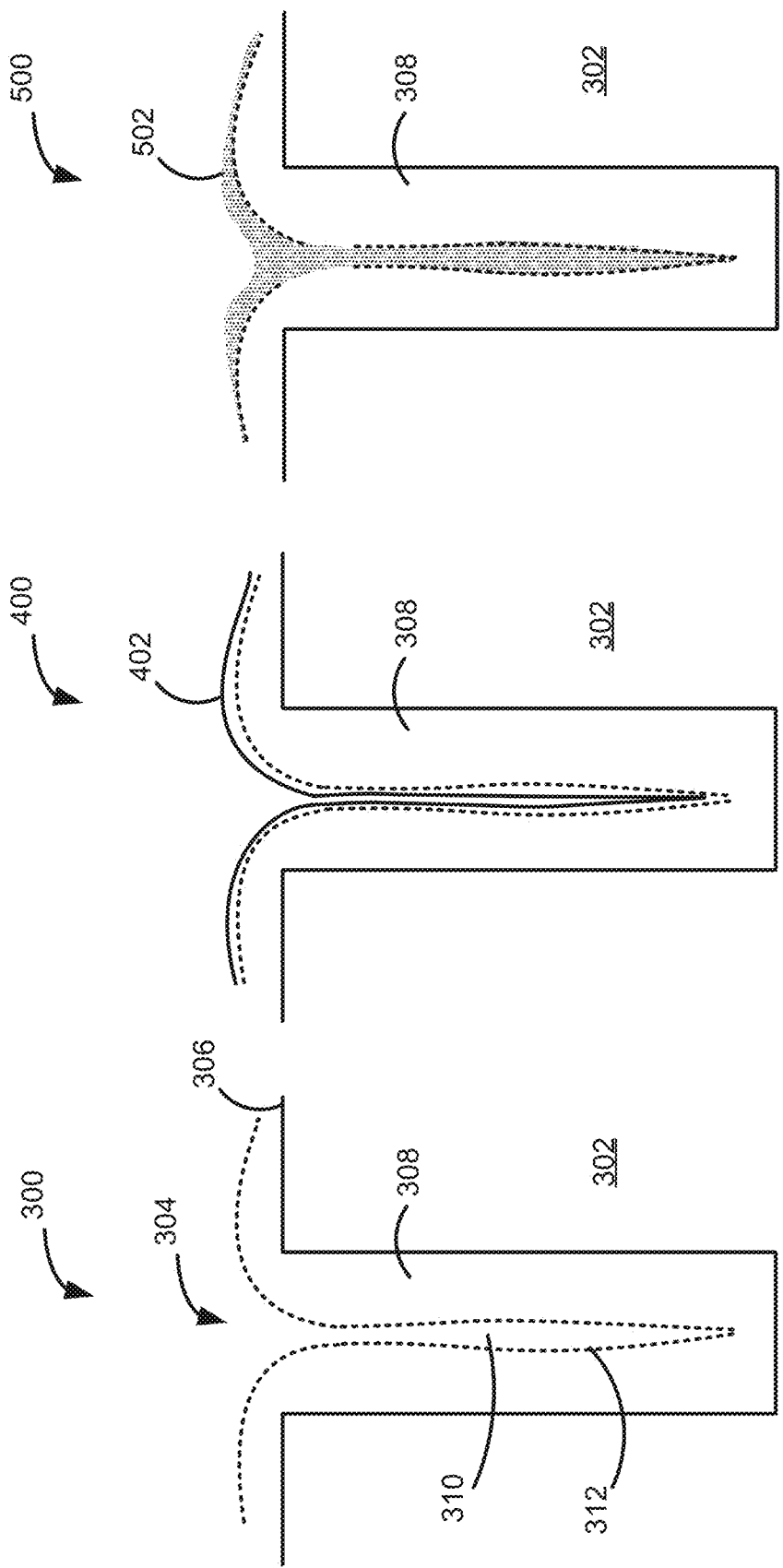

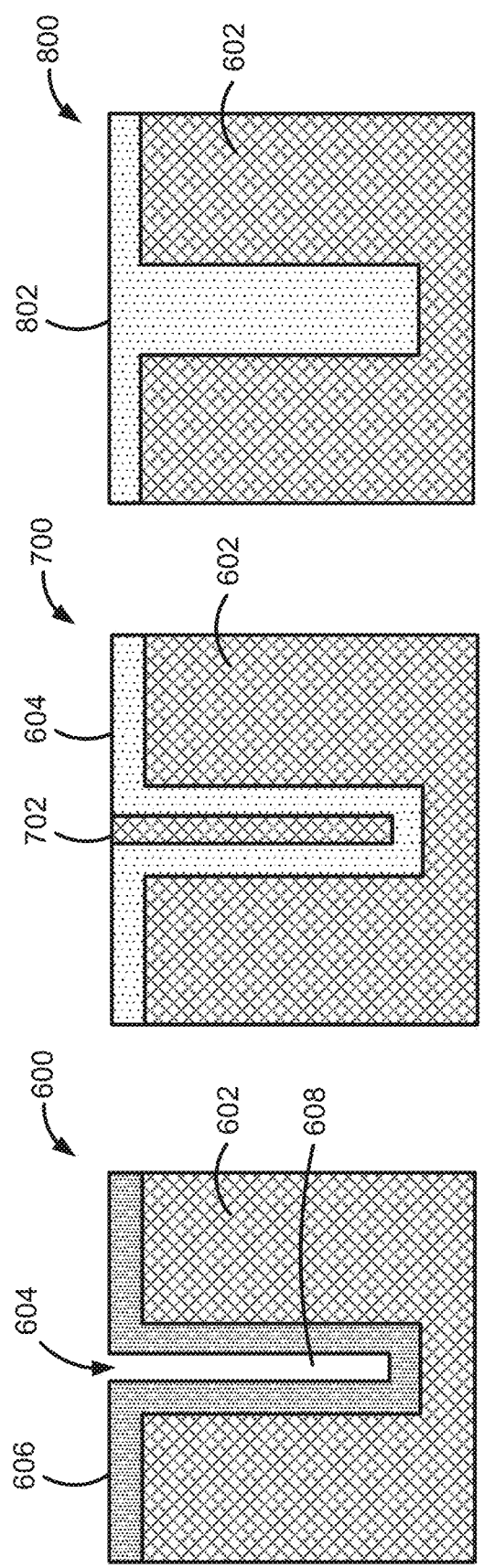

MULTIPLE-LAYER METHOD AND SYSTEM FOR FORMING MATERIAL WITHIN A GAP

CROSS-REFERENCE TO RELATED APPLICATIONS

This application claims priority to U.S. Provisional Patent Application Ser. No. 63/250,302, filed Sep. 30, 2021, and titled MULTIPLE-LAYER METHOD AND SYSTEM FOR FORMING MATERIAL WITHIN A GAP, the disclosure of which is hereby incorporated by reference in its entirety.

FIELD OF DISCLOSURE

The present disclosure generally relates to methods and systems used in the formation of electronic devices. More particularly, the disclosure relates to methods and systems suitable for at least partially filling gaps on a surface of a substrate during the manufacture of devices.

BACKGROUND OF THE DISCLOSURE

The scaling of semiconductor devices has led to significant improvements in speed and density of integrated circuits. However, conventional device scaling techniques face challenges for future technology nodes. In particular, with miniaturization of device features, void-free filling of high aspect ratio gaps (e.g., having an aspect ratio of three or higher) with desired material becomes increasingly challenging due to limitations of existing deposition processes.

For example, conformal deposition techniques often result in seam and/or void formation in material within the gap. Super conformal deposition techniques may result in seam formation in material within the gap. While some, e.g., bottom-up, techniques have been developed in an attempt to provide seamless material within a gap, such methods may not provide desired material within the gap in a seamless and/or void-free manner. Accordingly, improved methods and systems for forming desired material within a gap, while mitigating or minimizing void and/or seam formation within the material, are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to necessarily limit the scope of the claimed subject matter.

Various embodiments of the present disclosure relate to methods and systems of forming a structure, and more particularly, for providing material within a gap—e.g., at least partially filling the gap with desired material. As set forth in more detail below, exemplary methods include forming a layer of first material within the gap wherein a region forms within the first material and ceasing formation of the layer of first material before the region becomes a void or seam. A second material (e.g., an initially flowable material) can be formed within the region to at least partially fill the region with the second material. The first material may be material that is desired within the gap. The second material may, in some cases, be less desirable, but can be used to fill the gap, such that the gap is filled without an observable seam or a void or the void is minimized to the extent that it does not deleteriously affect desired properties. In some cases, the first and second material may mix to form a mixture, and in some cases, the mixture (e.g., properties thereof) may be indistinguishable from the first material.

Exemplary methods of forming a structure include forming a layer of first material within the gap, the first material having a region formed therein and forming an initially flowable material within the region. The region may be relatively small—e.g., less than 20, 10, 5, 2, or 1 percent of a volume and/or a cross-sectional area of the gap, such that most of the gap is filled with the first material. The initially flowable material can be used to fill or seal the region, such that the gap can be at least partially, and in some cases fully, filled with material in a void-free and seamless manner. In accordance with aspects of these embodiments, the method further comprises a step of converting the initially flowable material to a converted material. The step of converting can include providing one or more of a reactant and a precursor to the reaction chamber. In accordance with further examples of the disclosure, the method can include exposing one or more of the initially flowable material and the converted material to energy, such as one or more of heating the substrate (thermal energy), exposing the initially flowable material and/or the converted material to species generated from a direct plasma, an indirect plasma, a remote plasma or an ion beam, or radiation, such as ultraviolet radiation, and/or other treatment as noted herein. In accordance with further examples, the step of forming the layer of first material comprises conformally depositing the first material. The first material can be conformally deposited using, for example, a cyclical deposition process. Exemplary methods can further include a step of heat-treating the converted material.

In accordance with additional exemplary embodiments of the disclosure, a method of forming a structure includes providing a substrate within a reaction chamber, the substrate comprising a gap on a surface of the substrate; forming a layer of first material within the gap, the first material having a region formed therein; forming a layer of second material within the region; and heating the substrate to form a mixture of the first material and the second material within the region. In accordance with these examples of the embodiments, the first material and the second material comprise a metal or a semimetal.

In accordance with further exemplary embodiments, a method of forming a structure includes forming a, e.g., conformal layer comprising vanadium nitride, the conformal layer comprising vanadium nitride having a region formed therein; forming a layer comprising vanadium and oxygen within the region and heat treating. The step of heat treating can cause the layer comprising vanadium and oxygen to flow and/or can cause the layer comprising vanadium nitride and the layer comprising vanadium and oxygen to mix.

In accordance with yet further examples of the disclosure, a method of forming a structure includes forming a conformal layer comprising vanadium nitride using a vanadium precursor, the conformal layer comprising vanadium nitride having a region formed therein; using the vanadium precursor and an oxygen reactant, forming a layer comprising vanadium and oxygen within the region; and heat treating.

In accordance with further examples of the disclosure, a structure is provided. The structure includes a substrate including a gap and material (e.g., first material and second or initially flowable material and/or a mixture thereof) formed within the gap. The material can include material formed according to a method as described herein.

In accordance with further examples of the disclosure, a method includes providing a substrate within a reaction chamber, the substrate comprising a gap on a surface of the substrate; forming a layer of first material within the gap, the first material having a region formed therein; forming a layer of second material within the region; and applying extra energy the substrate to coalescence the first material and the second material to fill the region, wherein at least one of the first material or the second material comprise a metal. The method can further include a treatment. In some cases, the method can include a plurality of super cycles, a super cycle comprising a step of forming a layer of first material, forming a layer of second material, and the step of exposing the substrate the treatment. The treatment can include any treatment described herein, such as exposing the substrate to a plasma, exposing the substrate to at least one of radicals and ions, exposing the substrate to a thermal anneal (e.g., at least one of exposing the substrate to an oxidizing agent, a nitridation agent, a reducing agent, and an inert gas), and/or exposing the substrate to ultraviolet radiation.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

FIGS. 3-5 illustrate structures formed in accordance with examples of the disclosure.

FIGS. 6-8 illustrate additional structures formed in accordance with examples of the disclosure.

Figure 1:
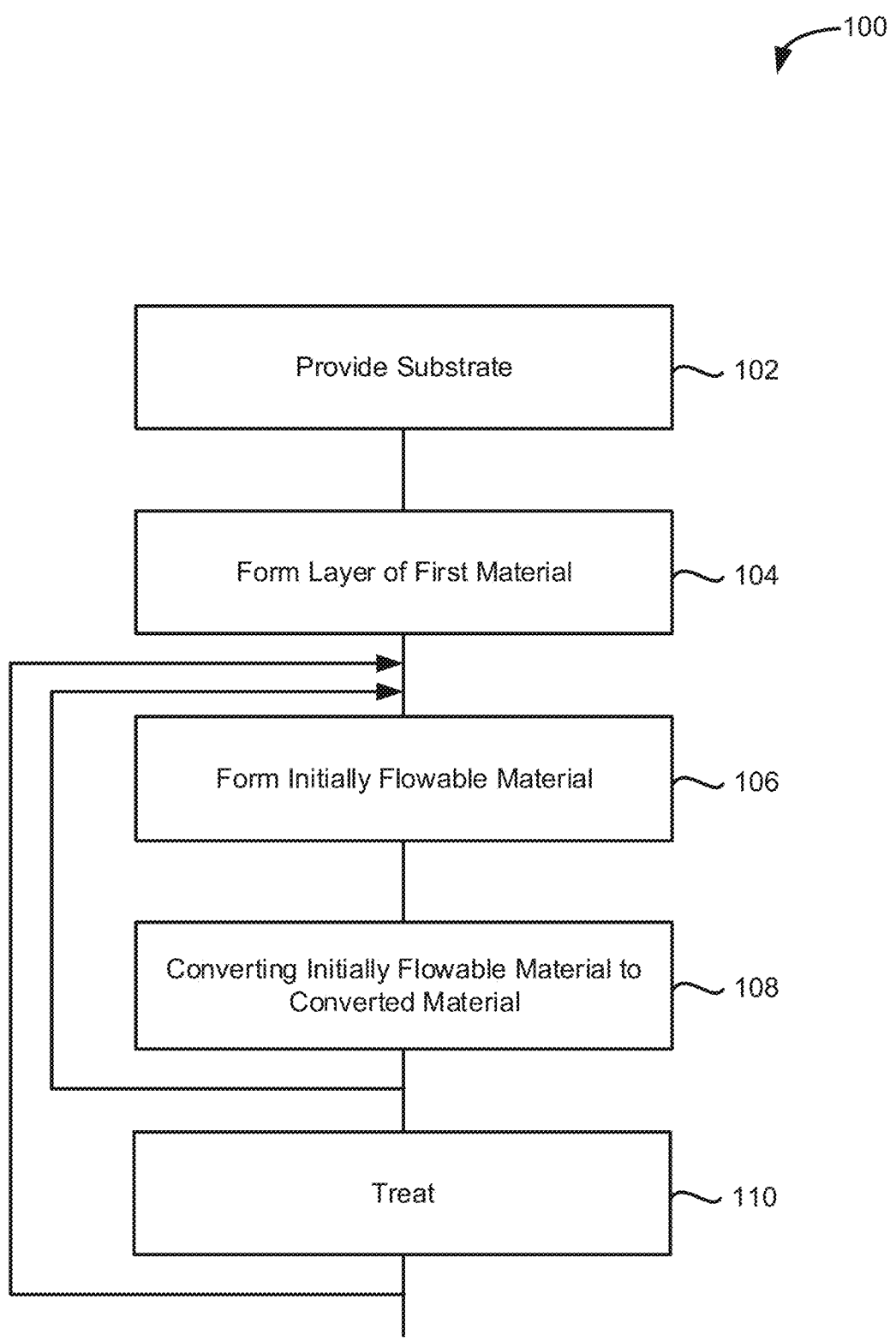
FIG. 1 illustrates an exemplary method in accordance with examples of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods and structures provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as examples. Unless otherwise noted, the exemplary embodiments or components thereof may be combined or may be applied separate from each other.

The present disclosure provides improved methods for at least partially filling a gap with material. As set forth in more detail below, methods described herein can be used to fill the gap with desired material (i.e., material having desired properties) in a void-free and/or seamless manner.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas. Exemplary seal gases include noble gases, nitrogen, and the like. In some cases, the term "precursor" can refer to a compound that participates in the chemical reaction that produces another compound, and particularly to a compound that constitutes a film matrix or a main skeleton of a film; the term "reactant" can be used interchangeably with the term precursor. In some cases, a reactant reacts with a precursor or derivative thereof to form a film, a layer, or material.

As used herein, the term "substrate" can refer to any underlying material or materials that can be used to form, or upon which, a device, a circuit, or a film can be formed by means of a method according to examples set forth herein. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. In accordance with examples of the disclosure, a substrate includes a gap. The gap can include a line or other surface modification to facilitate formation of the layer of first material, as described herein.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate. A film or layer may comprise material or a layer with pinholes and/or isolated islands. A film or layer may be at least partially continuous.

As used herein, a "structure" can be or can include a substrate as described herein. Structures can include one or more layers overlying the substrate, such as one or more layers formed according to a method as described herein.

The term "deposition process" as used herein can refer to the introduction of precursors, reactants, and/or other gases or reactive species into a reaction chamber to deposit or form a layer over a substrate. "Cyclical deposition processes" and non-cyclical deposition processes (e.g., chemical vapor deposition (CVD) and physical vapor deposition (PVD)) are examples of deposition processes.

The term "cyclic deposition process" or "cyclical deposition process" can refer to the sequential provision of precursors, reactants, and/or a plasma power to deposit a layer over a substrate and includes processing techniques, such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

As used herein, the term "purge" may refer to a procedure in which an inert or substantially inert gas (which can include a non-activated reactant in some cases) is provided to a reaction chamber in between two pulses of gases that react with each other. For example, a purge, e.g., using a noble gas, may be provided between a precursor pulse and a reactant pulse, thus avoiding or at least reducing gas phase interactions between the precursor and the reactant. It shall be understood that a purge can be effected either in time or in space, or both. For example, in the case of temporal purges, a purge step can be used, e.g., in the temporal sequence of providing a first precursor to a reaction chamber, providing a purge gas to the reaction chamber, and providing a reactant to the reaction chamber, wherein the substrate on which a layer is deposited does not move. For example, in the case of spatial purges, a purge step can take the following form: moving a substrate from a first location to which a first precursor is (e.g., continually) supplied, through a purge gas curtain, to a second location to which a reactant is (e.g., continually) supplied.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like.

As used herein, the term "comprising" indicates that certain features are included, but that it does not exclude the presence of other features, as long as they do not render the claim or embodiment unworkable. In some embodiments, the term "comprising" includes "consisting of" or "consisting essentially of." As used herein, the term "consisting of" indicates that no further features are present in the apparatus/method/product apart from the ones following said wording.

In this disclosure, the term "filling capability" refers to a capability of filling a gap substantially without voids (e.g., no void having a size of approximately 1 nm or greater, 2 nm or greater, 3 nm or greater or 5 nm or greater in diameter) and seams (e.g., no seam having a length of approximately 1 nm or greater, 2 nm or greater, 3 nm or greater or 5 nm or greater), wherein seamless/void-less bottom-up growth of material is observed. This disclosure provides methods and systems for forming material with filling capability.

In this disclosure, a recess between adjacent protruding structures and any other recess pattern may be referred to as a "gap." That is, a gap may refer to any recess pattern, including a hole/via, region between lines, and the like. A gap can have, in some embodiments, a width of about 10 nm to about 200 nm, about 20 nm to about 100 nm, and typically about 30 nm to about 50 nm. When a trench has a length that is substantially the same as its width, it can be referred to as a hole or a via. Holes or vias typically have a width of about 10 nm to about 200 nm, about 20 nm to about 100 nm. In some embodiments, a trench has a depth of about 10 nm to about 400 nm, about 20 nm to about 200 nm, about 30 nm to about 100 nm, and typically of about 40 nm to about 60 nm, but in some instances can be greater than 400 nm. In some embodiments, a gap has an aspect ratio of about 2 to about 50, about 2 to about 30, about 2 to about 20 and typically of about 2 to about 5, in some instances the aspect ratio be more than 5, more than 10, or more than 20 or more than 40. The dimensions of the gap may vary depending on process conditions, film composition, intended application, and the like.

As used herein, the term "height" may refer to the extent of a gap in a plane perpendicular to the surface of the substrate that comprises the gap in question.

As used herein, the term "width" may refer to the extent of a gap in a direction in a plane parallel to the surface of the substrate that comprises the gap in question.

As used herein, the term "length" may refer to the extent of a gap in a direction in a plane parallel to the surface of the substrate that comprises the gap in question. The directions in which the "width" and the "length" are measured are generally mutually perpendicular. It shall be understood that all dimensions, including length, width, and height of a structure, can be measured using routine techniques, such as scanning transmission electron microscopy (STEM). For clarification and for simplicity, voids or seams not visible or observable with routine techniques may not be considered as voids or seams in the context of this application.

Exemplary gaps include recesses, contact holes, vias, trenches, and the like. A gap generally comprises a distal part and a proximal part. The distal part comprises a distal surface. The proximal part comprises a proximal surface. It shall be understood that the gap does not necessarily have to be oriented vertically, but can extend in a horizontal direction. It shall be understood that the proximal part of the gap is the part of the gap that is closest to the substrate surface in which the gap forms a recess, and the distal part of the gap is the part of the gap that is most distant from that surface. A gap can include one or more sidewalls between the distal surface and the proximal surface.

In this disclosure, any defined meanings do not necessarily exclude ordinary and customary meanings in some embodiments.

Turning now to the figures, FIG. 1 illustrates a method 100 in accordance with examples of the disclosure. FIGS. 3-5 illustrate exemplary structures used during or formed using method 100. Method 100 can be used to form material within a gap in a void-free and/or seamless manner.

As illustrated, method 100 includes the step of providing a substrate (step 102), forming a layer of first material (step 104), and forming an initially flowable material (step 106), converting the initially flowable material to a converted material (step 108), and heat treating (step 110). Although separately illustrated, various steps of method 100 can be combined or can overlap. For example, steps 108 and 110 can overlap in some cases. As used herein, overlap means performed within the same reaction chamber for a period of time. Further, in some cases, a method may not employ all of the steps illustrated in FIG. 1. For example, a method can include steps 102-106 or 102-108.

As described in more detail below, various steps of method 100 can be performed within a gas-phase reactor system—e.g., within a single reactor system. For example, two or more steps of method 100 can be performed in one or more reaction chambers of a single reactor system or cluster tool or process module. Exemplary reactor systems are described below in connection with FIGS. 11-13.

During step 102, a substrate comprising a gap is provided, e.g., into a reaction chamber of a reactor system. The substrate can include a gap and a surface material within the gap. In accordance with examples of the disclosure, the reaction chamber can form part of a gas-phase reactor, such as a (e.g., plasma-enhanced or thermal) cyclical deposition reactor, such as a plasma-enhanced atomic layer deposition (PEALD) reactor, an atomic layer deposition (ALD) reactor, a pulsed chemical vapor deposition (CVD) reactor, a plasma-enhanced chemical vapor deposition (PECVD) reactor, a pulsed PECVD reactor, a physical vapor deposition (PVD) reactor, or the like. A type of reactor can depend on a subsequent step of method 100, such as a material formed during step 104. A reactor can be provided with a heater and/or plasma apparatus to activate reactions within the reaction chamber.

During step 102, the substrate can be brought to a desired temperature and pressure for a subsequent step—e.g., step 104, 106 and/or 108. While the specific temperatures and pressures can depend on the subsequent step and/or material deposited, by way of examples, a temperature (e.g., of a substrate or a substrate support) within a reaction chamber can be between about 20° C. and about 700° C., about 50° C. and about 500° C., or about 75° C. and about 300° C., or about 100° C. and about 700° C., or less than 500° C., or less than 450° C., or less than 400° C., or less than 300° C., or less than 200° C.; a pressure within the reaction chamber can be about $10^{-8}$ to about $10^6$ Pa or $10^{-5}$ to about $10^5$ Pa or $10^{-4}$ to about $10^4$ Pa.

During step 104, a layer of first material is formed within the gap. In accordance with examples of the disclosure, the step of forming a layer of first material within the gap comprises a cyclical deposition process, such as ALD, PEALD, cyclical CVD, pulsed CVD, or the like. In accordance with further examples, the step of forming the layer of first material comprises one or more conformal deposition processes, such as a cyclical process (e.g., an ALD process). By way of particular example, step 104 can include a thermal ALD process to form a conformal layer (also referred to as a liner). However, unless otherwise noted, embodiments of the disclosure are not so limited.

A thermal ALD process can include one or more deposition cycles, where, during each cycle, a precursor is introduced to a reaction chamber and is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant may subsequently be introduced into the process chamber for use in converting the chemisorbed precursor to the desired material. Purging steps can be utilized during one or more cycles, e.g., during each step of each cycle, to remove any excess precursor from the process chamber and/or remove any excess reactant and/or reaction byproducts from the reaction chamber. Such thermal ALD processes may be particularly useful during step 104 to fill high aspect ratio (e.g., aspect ratio greater than 10) gaps.

In some cases, a conformal layer exhibits a step coverage equal to or greater than 50%, or greater than 80%, or greater than 90%, or greater than 100%, or greater than 110%, or greater than 150%, or greater than 200%, in/on structures having aspect ratios (height/width) of more than about 2, more than about 5, more than about 10, more than about 25, more than about 50, more than about 100, or between about 10 and 100 or about 5 and 25. It shall be understood that the term "step coverage" refers to a thickness of a layer on a distal surface of a recess, divided by the thickness of that layer on a proximal surface of the recess, and is expressed as a percentage. It shall be understood that a distal portion of the gap feature refers to a portion of the gap feature that is relatively far removed from a substrate's surface, and that the proximal portion of a gap feature refers to a part of the gap feature which is closer to the substrate's surface compared to the distal/lower/deeper portion of the gap feature.

A composition of the layer of first material can depend of a variety of factors, including a surface of the underlying material—e.g., the surface material within the gap, including any treatment thereof and/or a desired application of the first material (e.g., logic, back end of line, patterning, memory, or the like). Exemplary first materials include, for example, conductive or dielectric materials. By way of particular examples, the first material can include silicon. For example, the first material can include silicon and one or more of O, N, and C. Particular exemplary first materials include silicon oxide, silicon nitride, silicon carbide, and mixtures thereof. The silicon oxide, silicon nitride, and/or silicon carbide may or may not be stoichiometric. In accordance with other examples, first material 308 includes a metal. For example, first material 308 can include a metal—e.g., one or more transition metals, such as transition metal alloys, oxides carbides, nitrides, silicates and mixtures thereof.

In accordance with examples of method 100, step 104 includes forming the layer of first material within the gap and ceasing the step of forming prior to a seam and/or an enclosed void forming. In some cases, a seam may form, but a void does not form within the first material.

FIG. 3 illustrates a structure 300 after step 104. As illustrated, structure 300 includes a substrate 302, including a gap 304 on a surface 306 of substrate 302. A layer of first material 308 is formed on surface 306, including within gap 304.

In accordance with examples of the disclosure, first material 308 includes a region 310 formed therein. Region 310 includes an area that does not include first material 308, but rather, at this stage, does not include any deposited material. In some cases, structure 300 can include a seam and region 310 that forms near a top (proximal) surface 306.

In accordance with examples of the described embodiments, material 308 can substantially fill gap 304. For example, a volume of the region 310 can be less than 20, 10, 5, 2, or 1 percent of a volume of gap 304. Additionally or alternatively, a cross-sectional area of region 310 can be less than 20, 10, 5, 2, or 1 percent of a cross-sectional area of gap 304. This allows gap 304 to be substantially filled with desired first material 308, while also allowing gap 304 to be closed in a seamless and/or void-free manner.

With reference to FIG. 4, during step 106, an initially flowable material 402 is formed within the region (e.g., region 310). In the examples of the disclosure, initially flowable material 402 can include a halogen-containing material, such as a halide or an oxyhalide. For example, initially flowable material 402 can be or include a metal or metalloid halide or a metal or metalloid oxyhalide. Suitable halides include fluorides, chlorides, bromides, and iodides. Suitable oxyhalides include oxyfluorides, oxychlorides, oxybromides, and oxyiodides. Particular examples of metal or metalloid halides or oxyhalides, include one or more of transition metal halides or oxyhalides, noble metal halides or oxyhalides, such as a halide or oxyhalide or one or more of Al, Zn, Ir, Pt, Mo, Ta, Nb, Sn, Se, Ti, B, In, or Sb. Specific examples include $AlCl_3$, $AlF_3$, $ZnF_2$, $ZnCl_2$, $ZnBr_2$, $ZnI_2$, $IrF_6$, $IrF_5$, $IrF_4$, $PtF_6$, $PtF_5$, $PtF_4$, $MoF_5$, $MoF_6$, $TaF_5$, $TaCl_5$, $NbF_5$, $NbCl_5$, $SnF_2$, $SnCl_2$, $SnBr_2$, $SnI_2$, $SeOBr_2$, and $SeOCl_2TiF_3$, $TiF_4$, $BCl_3$, $BF$, $InCl_3$, $SbF_x$, $SbCl_x$. In some cases, step 106 can include directly depositing the initially flowable material (e.g., halogen-containing material—e.g., a metal halide or metal oxyhalide). For example, a metal halide can be formed using a precursor that includes the metal and the halide and/or using a metal precursor and a halogen-containing reactant.

In other cases, the initially flowable material can be formed using a two-step process, including, for example, depositing a convertible material and providing a halogen-containing reactant or species derived from the halogen-containing reactant to the (or another) reaction chamber to form the initially flowable material by reacting the convertible material with the halogen-containing reactant or the species derived from the halogen-containing reactant. In these cases, the convertible material can be or include one or more of a metal, an alloy, a metal oxide, an elemental semiconductor, and a compound semiconductor. A compound semiconductor can be an alloy of two or more elemental semiconductors, such as SiGe. Alternatively, a compound semiconductor can be a chalcogenide, such as an oxide: CuO, $CuO_2$, InO, or SnO. Or, a compound semiconductor can be a multi-component material, such as indium gallium zinc oxide. By way of examples, the material layer can be or include a metal oxide or a metal oxynitride. A suitable metal oxide can be represented by $MO_x$, where M is a metal, such as transition metal, for example vanadium or titanium, or other metal such as aluminum, and where x ranges from about 0.5 to about 4. A suitable metal oxynitride can be represented by $MO_xN_y$, where M is a metal, such as transition metal, for example vanadium or titanium, or other metal such as aluminum, where x ranges from about 0.01 to about 4, and y ranges from about 0.01 to about 2. Particular examples include titanium oxide, aluminum oxide, titanium nitride, aluminum nitride, titanium oxynitride, and aluminum oxynitride, oxygen-containing metallic aluminum, nitrogen-containing metallic aluminum, oxygen and nitrogen-containing metallic aluminum, metallic titanium, oxygen-containing metallic titanium, nitrogen-containing metallic titanium, and oxygen and nitrogen-containing metallic aluminum.

The convertible material can then be exposed to one or more of a halogen reactant and/or an oxyhalogen reactant to thereby form a halogenated material and/or an oxyhalogenated material—i.e., the initially flowable material. Exemplary halogenating and oxyhalogenating agents/reactants include reactants including one or more of fluorine, chlorine, iodine, and bromine. Specific halogenating oxyhalogenating agents/reactants include $OF_2$, $FClO_2$, and $FClO_3$. Additional exemplary halogen reactants and/or an oxyhalogen reactants suitable for use with exemplary embodiments provided herein are provided in U.S. Pat. No. 10,280,519, entitled Thermal Atomic Layer Etching Processes, the contents of which are hereby incorporated herein by reference, to the extent such contents do not conflict with the present disclosure.

In accordance with yet further examples of the disclosure, step 106 can include providing a precursor that includes a (e.g., second) metal and a halogen—e.g., for example, when step 104 includes forming a first layer comprising a (e.g., first) metal. The first metal and the second metal can be the same or different. The first layer can be formed by, for example, using a metalorganic precursor and a reactant. The step of forming the initially flowable material (e.g., material 402) within the region (e.g., region 310) can include providing a metal halogen-containing precursor and the reactant or another reactant. In these cases, the step of forming the initially flowable material can include a non-saturating cyclical process, such that material 402 includes one or more halogens. Additionally or alternatively, material 402 can be formed using a reactant and/or precursor that does not fully convert halogen terminations to material to be grown, such that halogens from the precursor and/or reactant can remain in material 402.

In accordance with yet additional examples of the disclosure, step 106 can include forming the initially flowable material 402 by providing (e.g., thermal) halogenation agents, such as hydrogen halides and elemental halogens such as HCl, HF, $F_2$, and $Cl_2$ to react with first material 308 and/or a precursor, such as a transition metal oxide, for example vanadium oxide, to form the initially flowable material. Additional halogenation agents suitable for use with step 106 are disclosed in U.S. Pat. No. 10,280,519, which, as noted above, is incorporated herein by reference.

In accordance with yet additional examples of the disclosure, step 106 can include using the same reactant and/or precursor used during step 104, wherein at least one of the precursor and reactant includes a halogen, and increasing a halogen concentration of deposited material, such that step 106 includes forming graded material 402, with a halogen concentration of the graded material increasing towards a surface 312 of region 310. The increasing of the halogen concentration can be achieved by, for example, pulsing halogen-containing precursors in the last phases of a deposition process of step 104 and not converting all halogen terminations to the material grown in normal process.

Once the initially flowable material forms or during step 106, the initially flowable material can be heated to a flow temperature. In some cases, step 106 can be performed above the flow temperature, such that no additional heating of the initially flowable material is required.

Exemplary temperatures suitable for step 106 can vary according to the material formed during step 106. In accordance with examples of the disclosure, the temperature can be about 1, 2, 5, 10, 15, 20, or 25° C. above the melting point of initially flowable material. A pressure within the reaction chamber can be about $10^{-8}$ to about $10^6$ Pa or $10^{-5}$ to about $10^5$ Pa or $10^{-4}$ to about $10^4$ Pa during step 106.

Step 108 includes converting the initially flowable material (e.g. material 402) to a converted material. FIG. 5 illustrates a structure 500, including converted material 502 that forms within region 310.

Step 108 can include, for example, converting initially flowable material 402, such as a metal halide, to a more desirable material within gap 304, such as a metal oxide, or the like. In some cases, step 108 includes converting initially flowable material 402 to converted material 502, which may have a higher melting temperature and/or include desired properties, such as insulating properties, conductivity, etch resistance, or the like.

Specific process conditions during step 108 can vary depending on, for example, a composition of converted material 502. By way of examples, a temperature (e.g., of a substrate or a substrate support) within a reaction chamber can be between 20° C. and about 700° C., about 50° C. and about 500° C., or about 75° C. and about 300° C., or about 100° C. and about 700° C., or less than 500° C., or less than 450° C., or less than 400° C., or less than 300° C., or less than 200° C.; a pressure within the reaction chamber can about $10^{-8}$ to about $10^6$ Pa or $10^{-5}$ to about $10^5$ Pa or $10^{-4}$ to about $10^4$ Pa during step 108.

During step 108, excited species can be formed to react with initially flowable material 402 to form converted material 502. For example, plasmas, radicals, atoms, neutral and/or ion beams, or other excited forms of species can be used to convert initially flowable material 402 to converted material 502. In other words, step 108 can include forming activated species.

In some cases, a converting reactant can be used to form a plasma, such as a direct, indirect, or remote plasma, and activated or excited or atomic species from such plasma(s) can be used to convert material 402 to material 502.

A converting reactant can comprise one or more of a noble gas, such as helium or argon; an oxidizing reactant; a nitriding reactant; a carbon-containing reactant; and a reducing reactant. By way of examples, the oxidizing reactant can comprise an oxygen-containing gas, such as oxygen ($O_2$), $O_3$, $H_2O$, $H_2O_2$, or the like; the nitriding reactant can comprise a nitrogen-containing gas, such as nitrogen ($N_2$), ammonia, hydrazine, (e.g., alkyl) substituted hydrazine, forming gas, or the like; the carbon-containing reactant can include, for example, an alkane such as a C1 to C4 alkane such as $CH_4$; the reducing reactant can include, for example, a hydrogen-containing gas, such as $H_2$ or the like. Any of the oxidizing reactant, nitriding reactant, carbon-containing reactant, and a reducing reactant can include or be used to form excited species.

As illustrated in FIG. 1, in some cases, method 100 can also include a step 110 of treating the converted material 502. Treatment step 110 can be, for example, an anneal step. A temperature and gas within a/the reaction chamber can depend on desired material properties and of the composition of the converted material. In accordance with examples of the disclosure, step 110 includes performing a rapid thermal anneal (RTA) step. The RTA step can include exposing the substrate to infrared radiation for a brief time period (e.g., from at least 100 ms to at most 10 s). During an RTA, a substrate surface can be heated to, e.g., a temperature from at least 200° C. to at most 700° C. In accordance with additional examples, a substrate can be heated—e.g., using a susceptor heater and/or as a soak heat treatment process. In these cases, the substrate can be heated to a temperature of least 100° C. to at most 400° C. for a period of about 1 to about 600 seconds. The heat treatment can be performed in an atmosphere comprising one or more of a noble gas, an oxygen-containing gas, a nitrogen-containing gas, a carbon-containing gas, and a hydrogen-containing gas, such as the exemplary gases noted above in connection with step 108.

Additionally or alternatively, treatment step 110 can include exposing one or more of initially flowable material 402 and converted material 502 to energy, such as one or more of heating the substrate (thermal energy), exposing the initially flowable material and/or the converted material to species generated from a direct plasma, an indirect plasma, a remote plasma or an ion beam, and/or radiation, such as ultraviolet radiation.

As illustrated in FIG. 1, and as discussed below, various steps of method 100 can be repeated prior to proceeding to the next step. For example, steps 106 and 108 can be repeated a number of times to fill region 310.

Figure 2:
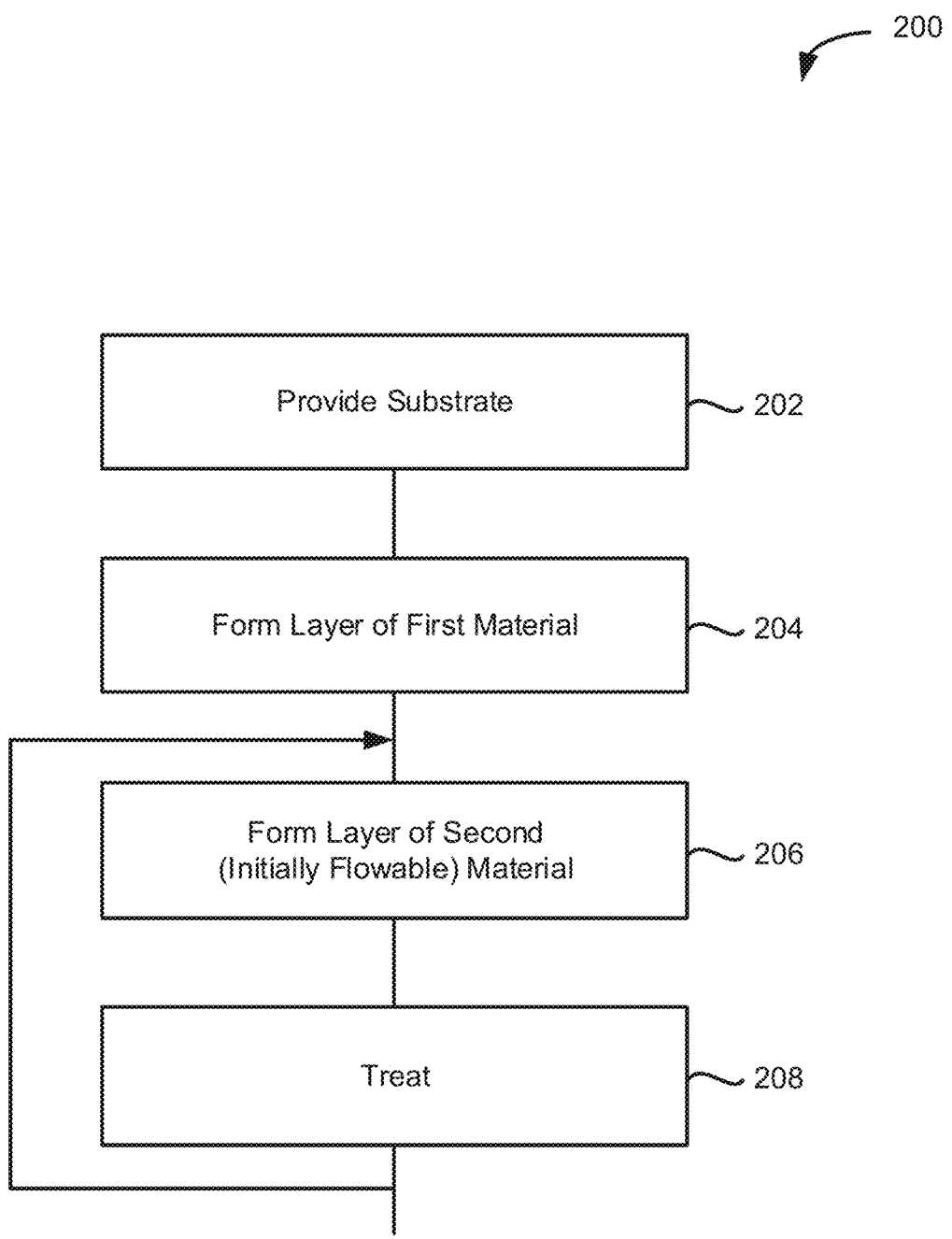
FIG. 2 illustrates another exemplary method in accordance with examples of the disclosure.

Turning now to FIG. 2, another method 200 for forming a structure is illustrated. Method 200 is similar to method 100, except method 200 does not include converting initially flowable material to converted material.

In the illustrated example, method 200 includes the steps of providing a substrate (step 202), forming a layer of first material (step 204), forming a layer of second material within the region material (step 206), and treating (step 208). In accordance with various aspects of these embodiments, the first material and the second material comprise a metal. FIGS. 6-8 illustrate structures forming in accordance with examples of the method illustrated in FIG. 2.

Step 202 can be the same or similar to examples of step 104, described above. For example, a substrate having a gap as described herein can be provided during step 202.

In accordance with examples of the disclosure, during step 204, a layer of first material is formed within the gap. Step 204 may be similar to step 104, described above. For example, in accordance with examples of these embodiments, step 204 can include deposition of a conformal layer of first material. The first material can include, for example, a metal nitride (e.g., $MN_x$, where M is a metal, such as transition metal, for example vanadium or titanium, or other metal such as aluminum and where x ranges from about 0.5 to about 4. In accordance with particular examples, the first material comprises (e.g., amorphous) vanadium nitride. As used herein, vanadium nitride can be a material layer that can be represented by a chemical formula that includes vanadium and nitrogen. A vanadium nitride layer can include additional elements, such as oxygen (e.g., a vanadium oxynitride layer) and the like.

In accordance with examples of the disclosure, step 204 can include using a cyclical (e.g., ALD) process that includes providing a metal (e.g., a vanadium) precursor and a reactant to a reaction chamber. Exemplary vanadium precursors include, for example, one or more of a vanadium halide, a vanadium oxyhalide, a vanadium organometallic compound, a vanadium metal organic compound, a vanadium beta-diketonate compound, a vanadium cyclopentadienyl compound, a vanadium alkoxide compound, a vanadium dialkylamido compound, a vanadium amidinate compound, a DAD ligand compound, where DAD is represented by 1,4-diaza-1,3-butadiene (RN=CR'CR'=NR, R=alkyl, aryl, R'=H, alkyl), and a vanadium heteroleptic or mixed ligand compound, or the like.

By way of particular examples, a vanadium halide can be selected from one or more of a vanadium fluoride, a vanadium chloride, a vanadium bromide, and a vanadium iodide. The vanadium halide can include only vanadium and one or more halogens—e.g., vanadium tetrachloride or the like. A vanadium oxyhalide can be selected from one or more vanadium oxyhalides, such as one or more of a vanadium oxyfluoride, a vanadium oxychloride, a vanadium oxybromide, and a vanadium oxyiodide. The vanadium oxyhalide can include only vanadium, oxygen, and one or more halides. By way of examples, the vanadium halide and oxyhalide can be selected from the group consisting of and include one or more of $VCl_4$, $VBr_4$, $VI_4$, $VOCl_4$, $VOBr_3$, and $VOI_3$ (respectively named as vanadium tetrachloride, vanadium tetrabromide, vanadium tetraiodide, vanadiumoxytrichloride, vanadiumoxytribromide, and vanadiumoxytriiodide).

Exemplary vanadium beta-diketonate compounds include $VO(acac)_2$, $VO(thd)_2$, $V(acac)_3$, $V(thd)_3$ (respectively named as oxobis(2,4-pentanedionato)vanadium(IV), oxobis(2,2,6,6-tetramethyl-3,5-hepanedionato)vanadium(IV), tris(2,4-pentanedionato)vanadium(IV), and tris(2,2,6,6-tetramethyl-3,5-hepanedionato)vanadium(IV)), and/or $VO(hfac)_2$ or $V(hfac)_3$, where hfac is a hexaflouroacetylacetonato ligand, and the like.

Exemplary vanadium cyclopentadienyl compounds include $VCp_2Cl_2$, $VCp_2$, $VCp_2(CO)_4$, and $VCpCl_3$, (respectively named as bischlorobis(cyclopentdienyl)vanadium (IV), bis(cyclopentadienyl)vanadium(II), cyclopentadienyl-vanadium tetracarbonyl, and trichloro(cyclopentadienyl) vanadium(IV)). Additional exemplary vanadium cyclopentadienyl compounds include variations of these compounds, where Cp is either unsubstituted or bearing one or more alkyl groups, e.g., MeCp, EtCp, iPrCp, and the like.

Exemplary vanadium alkoxide compounds include $V(OMe)_4$, $V(OEt)_4$, $V(OiPr)_4$, $V(OtBu)_4$, $VO(OMe)_3$, $VO(OEt)_3$, $VO(OiPr)_3$, and $VO(OtBu)_3$, (respectively named as tetrakis(methoxy)vanadium(IV), tetrakis(ethoxy)vanadium(IV), tetrakis(isopropoxy)vanadium(IV), tetrakis(t-butoxy)vanadium (IV), oxotris(methoxy)vanadium(IV), oxotris(ethoxy)vanadium(IV), oxotris(isopropoxy)vanadium(IV), and oxotris(t-butoxy)vanadium(IV)). Additional vanadium alkoxide compounds include variations of these compounds, where other alkoxy ligands are used.

Exemplary vanadium dialkylamido compounds include $V(NMe_2)_4$, $V(NEt_2)_4$, and $V(NEtMe)_4$, (respectively named as tetrakis(dimethylamido)vanadium(IV), tetrakis(diethylamido)vanadium(IV), and tetrakis(ethylmethylamido)vanadium(IV)).

Exemplary amidinate compounds include $V(iPrFMD)_3$, $V(iPrAMD)_3$, $V(tBuFMD)_3$, and $V(tBuAMD)_3$, where iPrFMD is an N,N'-diisopropylformamidinato ligand, iPrAMD is an N,N'-diisopropylacetamidinato ligand, tBuFMD is an N,N'-di-tert-butylformamidinato ligand, and tBuAMD is an N,N'-di-tert-butylacetamidinato ligand.

Examples of precursors including a DAD ligand include $V(DAD)_2$, $V(DAD)(CO)_4$, $VCp(DAD)(CO)_2$, $V(DAD)Cl_3$, and $V(DAD)_2(NO)_2$, where DAD is 1,4-diaza-1,3-butadiene (RN=CR'CR'=NR, where R=alkyl or an aryl group, and R'=H, or an alkyl group).

Further, exemplary vanadium precursors can include "heteroleptic" or mixed ligand precursors, where any combination of the exemplary ligand types in any attainable number (typically 3-5 ligands, but there can be exceptions) can be attached to the vanadium atom. Examples could include $V(Cl)x(NMe)_{4-x}$ and $V(Cl)_x(iPrAMD)_x$.

Use of vanadium halide precursors can be advantageous relative to methods that use other precursors, such as vanadium metalorganic precursors, because the vanadium halide precursors can be relatively inexpensive, can result in vanadium layers with lower concentrations of impurities, such as carbon, and/or processes that use such precursors can be more controllable—compared to processes that use metalorganic or other vanadium precursors. Further, such reactants can be used without the assistance of a plasma to form excited species. In addition, processes that use vanadium halide may be easier to scale up, compared to methods that use organometallic vanadium precursors.

The nitrogen reactant can be or include one or more of ammonia ($NH_3$), hydrazine ($N_2H_4$), a substituted (e.g., C1-C4 alkyl substituted) hydrazine, or the like. The nitrogen reactant can include or consist of nitrogen and hydrogen. In some cases, the nitrogen reactant does not include diatomic nitrogen. In the case of thermal cyclical deposition processes, a duration of the step of providing nitrogen reactant to the reaction chamber can be relatively long to allow the nitrogen reactant to react with the precursor or a derivative thereof. For example, the duration can be greater than or equal to 5 seconds or greater than or equal to 10 seconds or between about 5 and 10 seconds.

As noted above, In accordance with examples of the disclosure, the cyclical deposition process can be a thermal deposition process. In these cases, the cyclical deposition process does not include use of a plasma to form activated species for use in the cyclical deposition process. For example, the cyclical deposition process may not comprise formation or use of a nitrogen plasma, may not comprise formation or use of excited nitrogen species, and/or may not comprise formation or use of nitrogen radicals.

FIG. 6 illustrates a structure in which a layer of first material 606 is formed within a gap 604 on a surface of a substrate 602. Substrate 602 and gap 604 can be the same or similar to substrate 302 and gap 304 described above.

As above, in accordance with examples of the described embodiments, material 606 can substantially fill gap 604. For example, a volume of a region 608 can be less than 20, 10, 5, 2, or 1 percent of a volume of gap 604. Additionally or alternatively, a cross-sectional area of region 608 can be less than 20, 10, 5, 2, or 1 percent of a cross-sectional area of gap 604. This allows gap 604 to be substantially filled with desired first material 604 (e.g., vanadium nitride), while also allowing gap 604 to be closed in a seamless and/or void-free manner.

During step 206, a layer of second material is formed within the region 608. The second material can include an initially flowable material, such as an initially flowable material described above. In some cases, the second material comprises a metal (e.g., vanadium) and oxygen, such as vanadium oxide.

Step 206 can include any suitable deposition process. By way of example, step 604 includes a cyclical (e.g., thermal ALD) process. In some cases, step 206 includes using a same precursor used during step 204 (e.g., a vanadium precursor, such as $VCl_4$). In accordance with further examples, step 206 includes providing an oxygen reactant to the reaction chamber. The oxygen reactant can be selected from, for example, $O_2$, $H_2O$, and $H_2O_2$, or the like.

FIG. 7 illustrates a structure 700, including layer of first material 606 and layer of second material 702 formed within region 608.

With reference again to FIG. 2, step 208 can be the same or similar to step 110. For example, step 208 can include heating (e.g., annealing) the substrate to form a mixture of the first material and the second material within the region. The mixture need not be homogeneous. The annealing can result in a seamless mixture 802 of the first material and the second material, as illustrated in FIG. 8. The mixture can substantially (e.g., within 5 percent) include the properties of the first material. For example, in the case of vanadium nitride and vanadium oxide, after step 208, mixture 802 can be conductive and include the properties of an amorphous vanadium nitride layer. Mixture 802 can be suitable for use as a conductive via—e.g., for interconnect applications, as a work function metal, as a gate electrode, or the like. In some cases, mixture 802 may include a halogen. In other cases, mixture 802 does not include a halogen.

Figure 10:
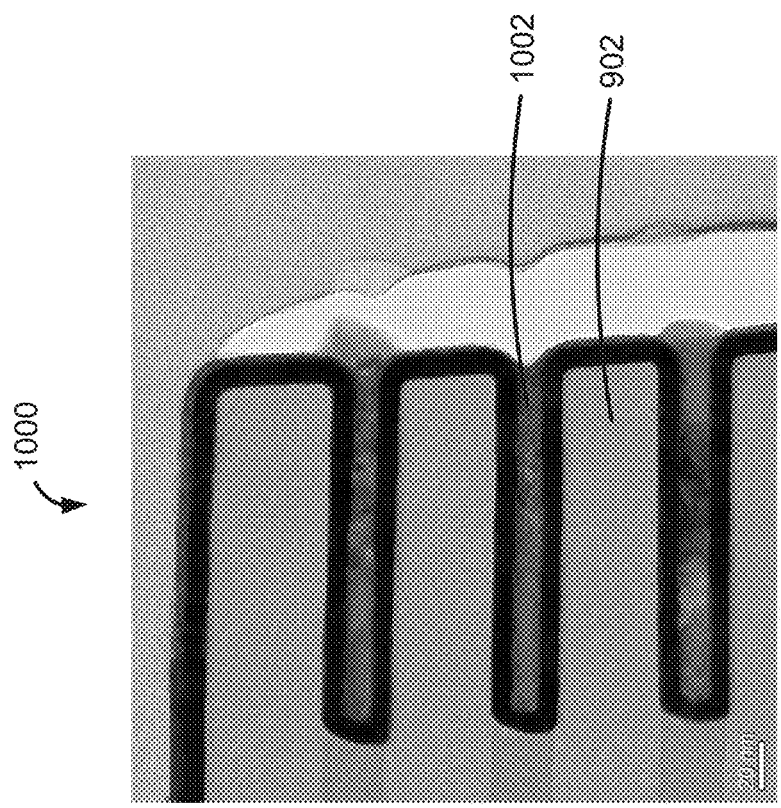
FIGS. 9 and 10 illustrate scanning transmission micrographs of structures formed in accordance with examples of the disclosure.
Figure 9:
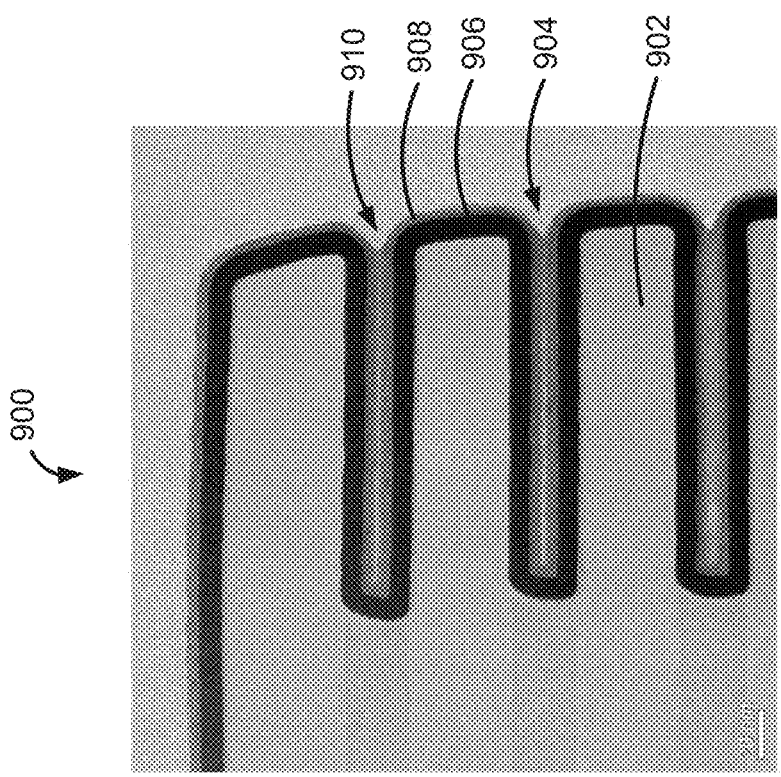

FIG. 9 illustrates a scanning transmission electron micrograph of a structure 900 formed according to method 200. Structure 900 includes a substrate 902, including gaps 904; a layer of first material 906 (e.g., amorphous vanadium nitride) formed overlying substrate 902 and within gaps 904; and a layer of second material 908 (e.g., vanadium oxide) formed within a region 910 of first material 906. FIG. 10 illustrates structure 1000 after structure 900 is exposed to a thermal anneal step (e.g., step 208). As illustrated, material 906 and material 908 can mix to form material 1002, which substantially includes the properties (e.g., composition, conductivity, and the like) of material 906.

Figure 11:
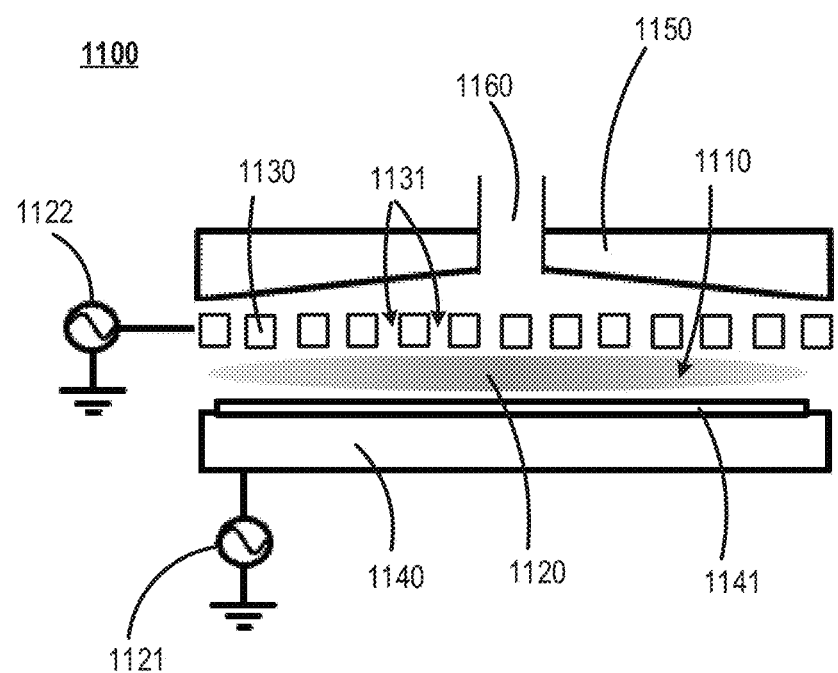
FIGS. 11-13 illustrate exemplary reactor systems in accordance with further examples of the disclosure.
Figure 12:
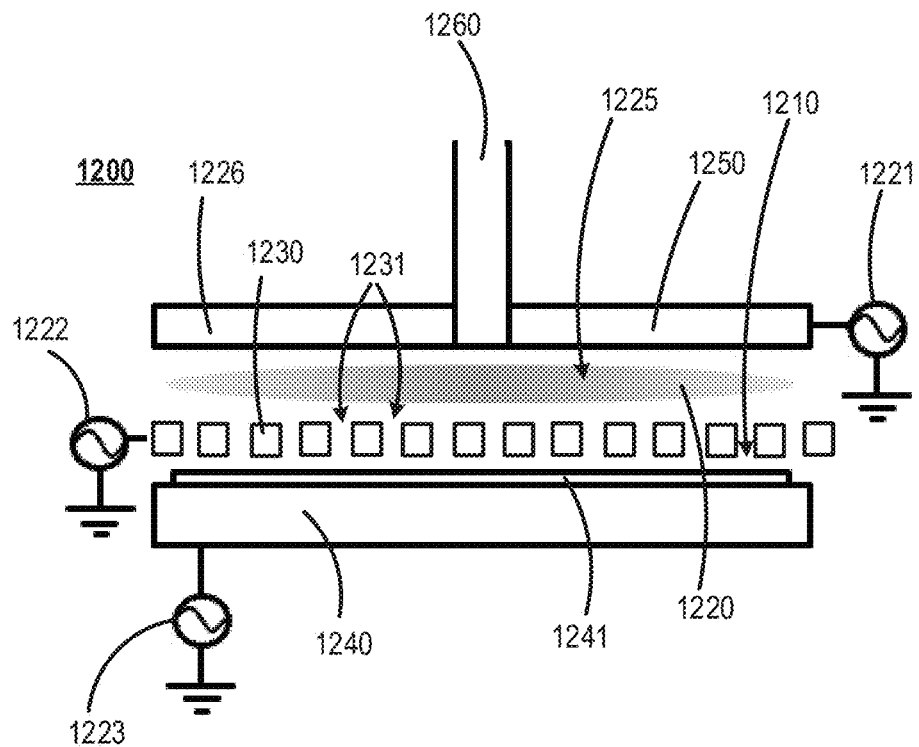
Figure 13:
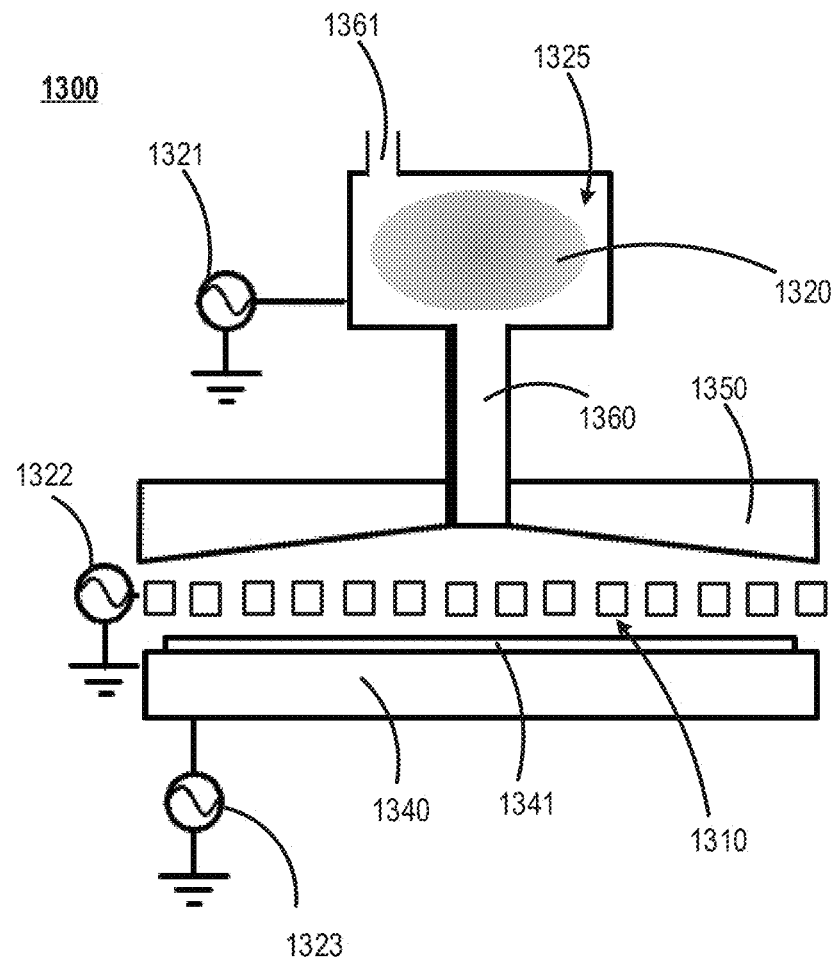

FIGS. 11-13 illustrate exemplary reactor systems 1100, 1200, and 1300, suitable for use with embodiments that include use of activated species that can be formed using a plasma. As noted above, some methods may alternatively be carried out using thermal deposition systems, which can be similar to systems 1100-1300, without the plasma apparatus. Reactor systems 1100-1300 may be used, for example, in carrying out method 100, whereas thermal apparatus may be preferred for method 200.

Reactor system 1100 includes a reaction space 1110, in which a plasma 1120 is generated. In particular, plasma 1120 is generated between a showerhead injector 1130 and a substrate support 1140.

In the configuration shown, reactor system 1100 comprises two alternating current (AC) power sources: a high frequency power source 1122 and a low frequency power source 1121. In the configuration shown, the high frequency power source 1122 supplies radio frequency (RF) power to the showerhead injector, and the low frequency power source 1121 supplies an alternating current signal to the substrate support 1140. The radio frequency power can be provided, for example, at a frequency of 13.56 MHz or higher. The low frequency alternating current signal can be provided, for example, at a frequency of 2 MHz or lower.

Process gas comprising precursor, reactant, or both, is provided through a gas line 1160 to a (e.g., conical) gas distributor 1150. The process gas then passes through holes 1131 in the showerhead injector 1130 to the reaction space 1110.

Whereas the high frequency power source 1122 is shown as being electrically connected to the showerhead injector 1130, and the low frequency power source 1121 is shown as being electrically connected to the substrate support 1140, other configurations are possible as well. For example, in some embodiments (not shown), both the high frequency power source and the low frequency power source can be electrically connected to the showerhead injector; or both the high frequency power source and the low frequency power source can be electrically connected to the substrate support; or the high frequency power source can be electrically connected to the substrate support, and the low frequency power source can be electrically connected to the showerhead injector.

FIG. 12 shows a schematic representation of another embodiment of a reactor system 1000 suitable for use in accordance with examples of the disclosure. Reactor system 1200 comprises a reaction space 1210, which is separated from a plasma generation space 1225 in which a plasma 1220 is generated. In particular, the reaction space 1210 is separated from the plasma generation space 1225 by a showerhead injector, and the plasma 1220 is generated between the showerhead injector 1230 and a plasma generation space ceiling 1226.

In the configuration shown, the system 1200 comprises three alternating current (AC) power sources: power source 1221, power source 1222, and power source 1233, each of which can be high or low frequency. In the configuration shown, the power source 1221 supplies (e.g., high frequency) plasma power to the plasma generation space ceiling 1226, power source 1222 supplies a (e.g., high frequency) power signal to the showerhead injector 1230, and power source 1223 supplies a (e.g., lower frequency) power signal to the substrate support 1240. When power source 1222 is a low frequency power source, power source 1222 can produce a remote plasma version (e.g., neutral beam plasma) of FIG. 11 and power source 1223 may not have a function. A substrate 1241 is provided on the substrate support 1240. The high frequency power can be provided, for example, at a frequency of 13.56 MHz or higher. The low frequency alternating current signal can be provided, for example, at a frequency of 2 MHz or lower.

Process gas comprising precursor, reactant, or both, can be provided through a gas line 1260 that passes through the plasma generation space ceiling 1226, to the plasma generation space 1225. Active species, such as ions and/or radicals generated by the plasma 1225 from the process gas, pass through holes 1231 in the showerhead injector 1230 to the reaction space 1210.

FIG. 13 shows a schematic representation of another embodiment of reactor system 1300 suitable for in accordance with examples. Reactor 1300 comprises a reaction space 1310, which is operationally connected to a remote plasma source 1325, in which a plasma 1320 is generated. Any sort of plasma source can be used as a remote plasma source 1325, for example, an inductively coupled plasma, a capacitively coupled plasma, or a microwave plasma.

In particular, active species are provided from the plasma source 1325 to the reaction space 1310 via an active species duct 1360, to a conical distributor 1350, through holes 1331 in a shower plate injector 1330 to the reaction space 1310. Thus, active species can be provided to the reaction space in a uniform way.

In the configuration shown, the reactor 1300 comprises three alternating current (AC) power sources: a remote plasma power source 1321 and power sources 1322, 1323; e.g., a high and/or low frequency power source 1322 and a low frequency power source 1323. In the configuration shown, the high frequency power source 1322 supplies radio frequency (RF) power to showerhead injector 1330, and the low frequency power source 1323 supplies an alternating current signal to the substrate support 1340. A substrate 1341 is provided on the substrate support 1340. The radio frequency power can be provided, for example, at a frequency of 13.56 MHz or higher—e.g., 2.45 GHz for microwave remote plasmas (1321, 1322). The low frequency alternating current signal of the first and second low frequency power sources (1323) can be provided, for example, at a frequency of 2 MHz or lower.

In some embodiments (not shown), an additional high frequency power source can be electrically connected to the substrate support. Thus, a direct plasma can be generated in the reaction chamber.

Process gas comprising precursor, reactant, or both, can be provided to the plasma source 1325 by means of a gas line 1361. Active species, such as ions and/or radicals generated by the plasma 1325 from the process gas, are guided to the reaction chamber 1310.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of forming a structure, the method comprising the steps of:
   providing a substrate within a reaction chamber, the substrate comprising a gap on a surface of the substrate;

forming a layer of first material within the gap, the first material having a region formed therein; and forming an initially flowable material within the region, wherein the first material is conductive.

2. The method of claim 1, wherein a cross-sectional area of the region is less than 10, 5, 2, or 1 percent of a cross-sectional area of the gap.

3. The method of claim 1, wherein a volume of the region is less than 10, 5, 2, or 1 percent of a volume of the gap.

4. The method of claim 1, further comprising a step of converting the initially flowable material to a converted material.

5. The method of claim 4, wherein the step of converting comprises providing one or more converting reactants and/or excited species formed from one or more converting reactants to the reaction chamber.

6. The method of claim 4, further comprising exposing one or more of the initially flowable material and the converted material to energy, wherein the step of exposing one or more of the initially flowable material and the converted material to energy comprises one or more of heating the substrate, exposing the initially flowable material and/or the converted material to species generated from a direct plasma, an indirect plasma, a remote plasma or an ion beam, or radiation.

7. The method of claim 4, wherein the step of converting comprises forming activated species.

8. The method of claim 1, wherein the step of forming the layer of first material comprises conformally depositing the first material.

9. The method of claim 1, wherein the step of forming the layer of first material comprises a cyclical deposition process.

10. The method of claim 1, wherein the first material comprises silicon and one or more of O, N, and C.

11. The method of claim 1, wherein the step of forming the initially flowable material comprises providing a halogen-containing reactant or species derived from the halogen-containing reactant to the reaction chamber.

12. The method of claim 1, wherein the step of forming the initially flowable material comprises providing a metal precursor.

13. The method of claim 1, wherein the step of forming the initially flowable material comprises depositing halogen-containing material, wherein the step of forming the halogenated material comprises providing a precursor comprising a metal and a halogen to the reaction chamber.

14. The method of claim 1, wherein the step of forming the initially flowable material comprises using one or more of a precursor and a reactant used to form the layer of first material.

15. A method of forming a structure, the method comprising the steps of:

providing a substrate within a reaction chamber, the substrate comprising a gap on a surface of the substrate;

forming a layer of first material within the gap, the first material having a region formed therein;

forming a layer of second material within the region; and heating the substrate to form a mixture of the first material and the second material within the region, wherein the first material and the second material comprise a metal.

16. The method of claim 15, wherein the mixture is conductive.

17. The method of claim 15, wherein the metal nitride comprises vanadium nitride, and wherein the metal oxide comprises vanadium oxide.

18. The method of claim 15, further comprising a step of heat treating.

19. A method of forming a structure, the method comprising the steps of:

providing a substrate within a reaction chamber, the substrate comprising a gap on a surface of the substrate;

forming a layer of first material within the gap, the first material having a region formed therein;

forming a layer of second material within the region; and applying extra energy to the substrate to coalesce the first material and the second material to form a seamless mixture of the first material and the second material to fill the region, wherein at least one of the first material or the second material comprises a metal.

20. The method according to claim 19, further comprising a step of exposing the substrate to a treatment, the method comprising a plurality of super cycles, a super cycle comprising a step of forming a layer of first material, forming a layer of second material, and the step of exposing the substrate to the treatment.

* * * * *